(12) United States Patent
Al-Shyoukh (10) Patent No.: US 8,305,059 B2
(45) Date of Patent: Nov. 6, 2012

(54) VOLTAGE REGULATOR CIRCUIT

(75) Inventor: Mohammad A. Al-Shyoukh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 849 days.

(21) Appl. No.: 12/346,169

(22) Filed: Dec. 30, 2008

(65) Prior Publication Data

US 2010/0164457 A1      Jul. 1, 2010

(51) Int. Cl.
*G05F 1/40*       (2006.01)
*G05F 1/56*       (2006.01)

(52) U.S. Cl. ........ 323/282; 323/284; 323/285; 323/286; 323/222; 323/224

(58) Field of Classification Search .................. 323/282, 323/284, 285, 286, 222, 224
See application file for complete search history.

(56) References Cited

U.S. PATENT DOCUMENTS

| 7,482,791 | B2 * | 1/2009 | Stoichita et al. | ............... 323/271 |
| 2005/0035748 | A1 * | 2/2005 | Inn | ................................ 323/285 |
| 2006/0025104 | A1 * | 2/2006 | Reed et al. | .................. 455/343.1 |
| 2006/0055388 | A1 * | 3/2006 | Tang et al. | ...................... 323/284 |
| 2006/0152205 | A1 * | 7/2006 | Tang et al. | ...................... 323/284 |
| 2006/0220699 | A1 * | 10/2006 | Labbe | ........................... 327/108 |
| 2008/0049478 | A1 * | 2/2008 | Wong et al. | .................... 363/132 |
| 2008/0088284 | A1 * | 4/2008 | Weng | .............................. 323/271 |
| 2008/0088292 | A1 * | 4/2008 | Stoichita et al. | .............. 323/285 |
| 2009/0066303 | A1 * | 3/2009 | Smith et al. | .................... 323/274 |

* cited by examiner

*Primary Examiner* — Bao Q Vu
(74) *Attorney, Agent, or Firm* — William B. Kempler; Wade J. Brady, III; Frederick J. Telecky, Jr.

(57) ABSTRACT

One embodiment of the invention includes a regulator circuit that regulates a substantially constant magnitude of an output voltage at an output node. The circuit includes a master stage configured to set a first threshold voltage and a second threshold voltage. The first threshold voltage can have a magnitude that is greater than the second threshold voltage. The circuit also includes a charging follower stage configured to conduct a first current from a first power rail to the output node. The first current can increase in response to a transient decrease of the output voltage relative to the first threshold voltage. The circuit further includes a discharging follower stage configured to conduct a second current from the output node to a second power rail. The second current can increase in response to a transient increase of the output voltage relative to the second threshold voltage.

15 Claims, 6 Drawing Sheets

VOLTAGE REGULATOR CIRCUIT

TECHNICAL FIELD

This invention relates to electronic circuits, and more specifically to a voltage regulator circuit.

BACKGROUND

Half-bridge and full-bridge power stages are commonly employed as power delivery stages in applications where power conversion at high efficiencies is required. For example, half-bridge and full-bridge power stages can be employed in DC-DC power converters and class-D audio power amplifiers. In portable power integrated circuits (ICs), power conversion and power delivery to the load is required at exceptionally high efficiencies. As an example, limited battery power typically needs to be delivered to the load at minimal losses to prolong battery life.

In portable electronics applications, power management, audio, and digital circuitry can be integrated on one system-on-chip (SoC) die to create products with a small form factor. However, the integration of power applications on digital complementary metal-oxide semiconductor (CMOS) technologies presents numerous challenges. Digital CMOS process technologies are primarily optimized for switching speed along with maximizing the logic-gate count realizable within a given area.

As an example, a given transistor in such digital CMOS processes can have a feature size that can vary from 45 nm to 0.18 μm. A maximum gate-source breakdown voltage of the given transistor can thus vary from 1.0 volts to 1.8 volts. However, a battery voltage in portable devices can typically range from 2.3 volts to 5.5 volts, which is a voltage that is significantly larger than that which can be tolerated on the typical CMOS transistor devices. Thus, a voltage regulator circuit, such as a voltage sub-regulator, can be employed to generate a bias voltage range in which CMOS transistor devices can be operated. In addition, a typical voltage regulator circuit, such as used in a high and/or low-side gate driver for a power CMOS device, can implement a large, often externally connected capacitor that can maintain the bias voltage range as substantially constant with respect to transient conditions.

SUMMARY

One embodiment of the invention includes a regulator circuit that regulates a substantially constant magnitude of an output voltage at an output node. The circuit includes a master stage configured to set a first threshold voltage and a second threshold voltage. The first threshold voltage can have a magnitude that is greater than the second threshold voltage. The circuit also includes a charging follower stage configured to conduct a first current from a first power rail to the output node. The first current can increase in response to a transient decrease of the output voltage relative to the first threshold voltage. The circuit further includes a discharging follower stage configured to conduct a second current from the output node to a second power rail. The second current can increase in response to a transient increase of the output voltage relative to the second threshold voltage.

Another embodiment of the invention includes a method for regulating a substantially constant magnitude of an output voltage at an output node. The method includes generating a bias current via a current source and mirroring the bias current via at least one current-mirror to set a first threshold voltage and a second threshold voltage. The first threshold voltage can have a magnitude that is greater than the second threshold voltage. The method also includes setting a first current from a first power rail to the output node based on the first threshold voltage and setting a second current from the output node to a second power rail. The first and second currents can have substantially equal magnitudes during a steady-state condition. The method further includes increasing a magnitude of the first current in response to a transient decrease of the output voltage relative to the first threshold voltage and increasing a magnitude of second current in response to a transient increase of the output voltage relative to the second threshold voltage.

Another embodiment of the invention includes a regulator circuit that regulates a substantially constant magnitude of an output voltage at an output node. The circuit includes means for amplifying a reference voltage based on a bias current to generate an amplified voltage. The amplified voltage can have a substantially constant magnitude that is approximately equal to the output voltage. The circuit also includes means for setting a first threshold voltage and a second threshold voltage based on the amplified voltage. The first threshold voltage can have a magnitude that is greater than the amplified voltage and the second threshold voltage having a magnitude that is less than the amplified voltage. The circuit also includes means for sourcing current to the output node from a first power rail in response to a transient decrease of the output voltage relative to the first threshold voltage and means for sinking current from the output node to a second power rail in response to a transient increase of the output voltage relative to the second threshold voltage.

DETAILED DESCRIPTION

The invention relates to electronic circuits, and more specifically to a voltage regulator circuit. The voltage regulator circuit can include a master stage, a charging follower stage, and a discharging follower stage. The master stage can include at least one current-mirror that mirrors a bias current. One of the at least one current-mirrors can mirror the bias current to an amplifier that sets a first threshold voltage and a second threshold voltage. The first threshold voltage can be provided to the charging follower stage and the second threshold voltage can be provided to the discharging follower stage. As an example, the amplifier can set a gate-source voltage of a pair of transistors through which the bias current is mirrored, such as to set the respective first and second threshold voltages at a gate of each of the pair of transistors.

The charging follower stage can be configured between a first voltage rail, such as a battery voltage rail, and the output node. Similarly, the discharging follower stage can be configured between the output node and a second voltage rail, such as ground. The voltage regulator can be configured to maintain a substantially constant magnitude of the output voltage relative to one of the voltage rails. Thus, the first and second threshold voltages can be set to be substantially constant relative to the one of the first and second voltage rails. As a result, upon the output voltage experiencing a transient decrease in magnitude, the charging follower stage can source current from one or more current sources to the output node to maintain the steady-state magnitude of the output voltage. Similarly, upon the output voltage experiencing a transient increase in magnitude, the discharging follower stage can sink current through one or more current sources from the output node to maintain the steady-state magnitude of the output voltage. For example, the charging and discharging follower stages can each conduct a quiescent current that is substantially equal in a steady-state, with the respective one of the charging and discharging follower stages increasing the current flow in response to the respective transient condition.

As an example, each of the charging and discharging follower stages can include one or more transistor current sources. The transistor current sources can be controlled by the respective first and second threshold voltages to set the quiescent currents into and out of the output node. Furthermore, one of the charging and discharging follower stages can include more of the transistor current sources, such as a series of current-mirrors, than the other of the charging and discharging follower stages. Accordingly, in response to a substantially equal transient voltage change of the output voltage, the additional transistor current sources can conduct a greater amount of current to increase a slew-rate recovery of the output voltage in response to the transient condition.

Figure 1:
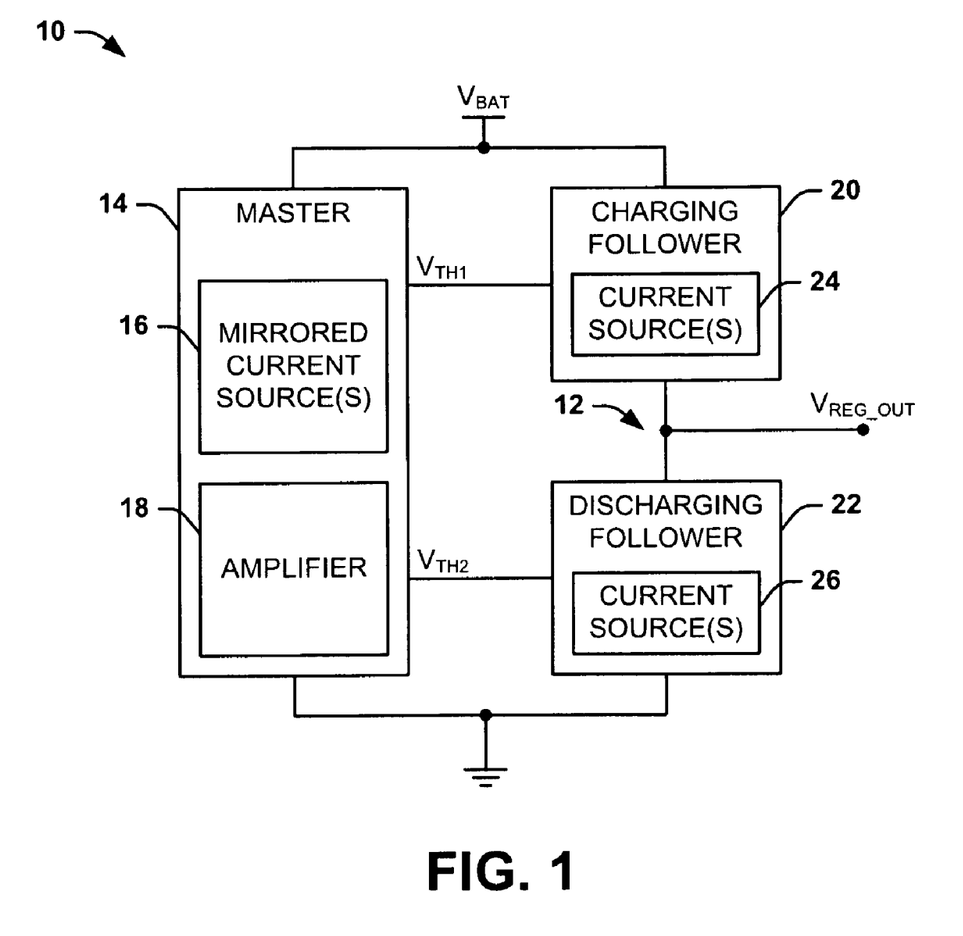
FIG. 1 illustrates an example of a voltage regulator system in accordance with an aspect of the invention.

FIG. 1 illustrates an example of a voltage regulator system 10 in accordance with an aspect of the invention. The voltage regulator system 10 is interconnected between a positive voltage rail, demonstrated in the example of FIG. 1 as a battery voltage $V_{BAT}$, and a negative voltage rail, demonstrated in the example of FIG. 1 as ground. The voltage regulator system 10 is configured to generate and maintain a substantially constant magnitude of an output voltage $V_{REG\_OUT}$ at an output node 12. As an example, the voltage regulator system 10 can be implemented as a sub-regulator in a high and/or low-side gate driver in a DC-DC power converter or audio amplifier. Therefore, the voltage regulator system 10 can maintain the output voltage $V_{REG\_OUT}$ at a substantially constant magnitude despite voltage transients, such as resulting from a large gate capacitance of a switched high-side or low-side power field-effect transistor (FET).

The voltage regulator system 10 includes a master stage 14. The master stage 14 includes one or more mirrored current sources 16 that are configured to generate and mirror a predetermined bias current. The master stage 14 also includes an amplifier 18, which can be configured as a differential amplifier. As an example, one of the mirrored current sources 16 can mirror the bias current to the amplifier 18. In response, the amplifier 18 set a first threshold voltage $V_{TH1}$ and a second threshold voltage $V_{TH2}$. In addition, the master stage 14 can be a static stage, such that it is substantially unaffected by transient conditions, thus resulting in the first and second threshold voltages $V_{TH1}$ and $V_{TH2}$ being substantially constant with respect to at least one of the battery voltage $V_{BAT}$ and ground.

The voltage regulator system 10 also includes charging follower stage 20 and a discharging follower stage 22. The charging follower stage 20 is interconnected between the battery voltage $V_{BAT}$ and the output node 12 and the discharging follower stage 22 is interconnected between the output node 12 and ground. The charging follower stage 20 includes one or more current sources 24 that are controlled by the first threshold voltage $V_{TH1}$ and the discharging follower stage 22 includes one or more current sources 26 that are controlled by the second threshold voltage $V_{TH2}$. Thus, the current source(s) 24 and the current source(s) 26 can collectively set the output voltage $V_{REG\_OUT}$ based on a quiescent current flow into and out of the output node 12 that is set by the first and second threshold voltages $V_{TH1}$ and $V_{TH2}$.

As an example, each of the current source(s) 24 and 26 can be configured as transistor current sources having source nodes that are coupled to the output node 12. Thus, the gates of the transistor current source(s) 24 can be controlled by the first threshold voltage $V_{TH1}$ and the gates of the transistor current source(s) 26 can be controlled by the second threshold voltage $V_{TH2}$. Therefore, the output voltage $V_{REG\_OUT}$ can be functionally related to the first and second threshold voltages $V_{TH1}$ and $V_{TH2}$ based on having a difference between the respective first and second threshold voltages $V_{TH1}$ and $V_{TH2}$ that is approximately equal to a gate-source voltage of the respective current source(s) 24 and 26. Accordingly, transient conditions associated with the output voltage $V_{REG\_OUT}$ can affect the magnitude of the current flow into the output node 12 from the current source(s) 24 and/or the magnitude of the current flow from the output node 12 to the current source(s) 26 based on a change in the gate-source voltage of the respective current sources(s) 24 and 26.

Specifically, a transient decrease of the output voltage $V_{REG\_OUT}$ can result in an increase in a gate-source voltage of the current source(s) 24. In response, the current source(s) 24 can increase the amount of current that is conducted from the battery voltage $V_{BAT}$ to the output node 12. Similarly, a transient increase of the output voltage $V_{REG\_OUT}$ can result in an increase in a gate-source voltage of the current source(s) 26. In response, the current source(s) 26 can increase the amount of current that is conducted from the output node 12 to ground. In addition, one of the current source(s) 24 and 26 can include more current sources coupled in parallel, such as a parallel set of current-mirrors, than the other of the current source(s) 24 and 26. As a result, the respective one of the current source(s) 24 and 26 can conduct a greater magnitude of current than the other of the current source(s) 24 and 26 in response to a given transient condition, thus providing the voltage regulator system 10 with an enhanced slew with respect to compensating for the positive or negative transient condition of the output voltage $V_{REG\_OUT}$.

Figure 2:
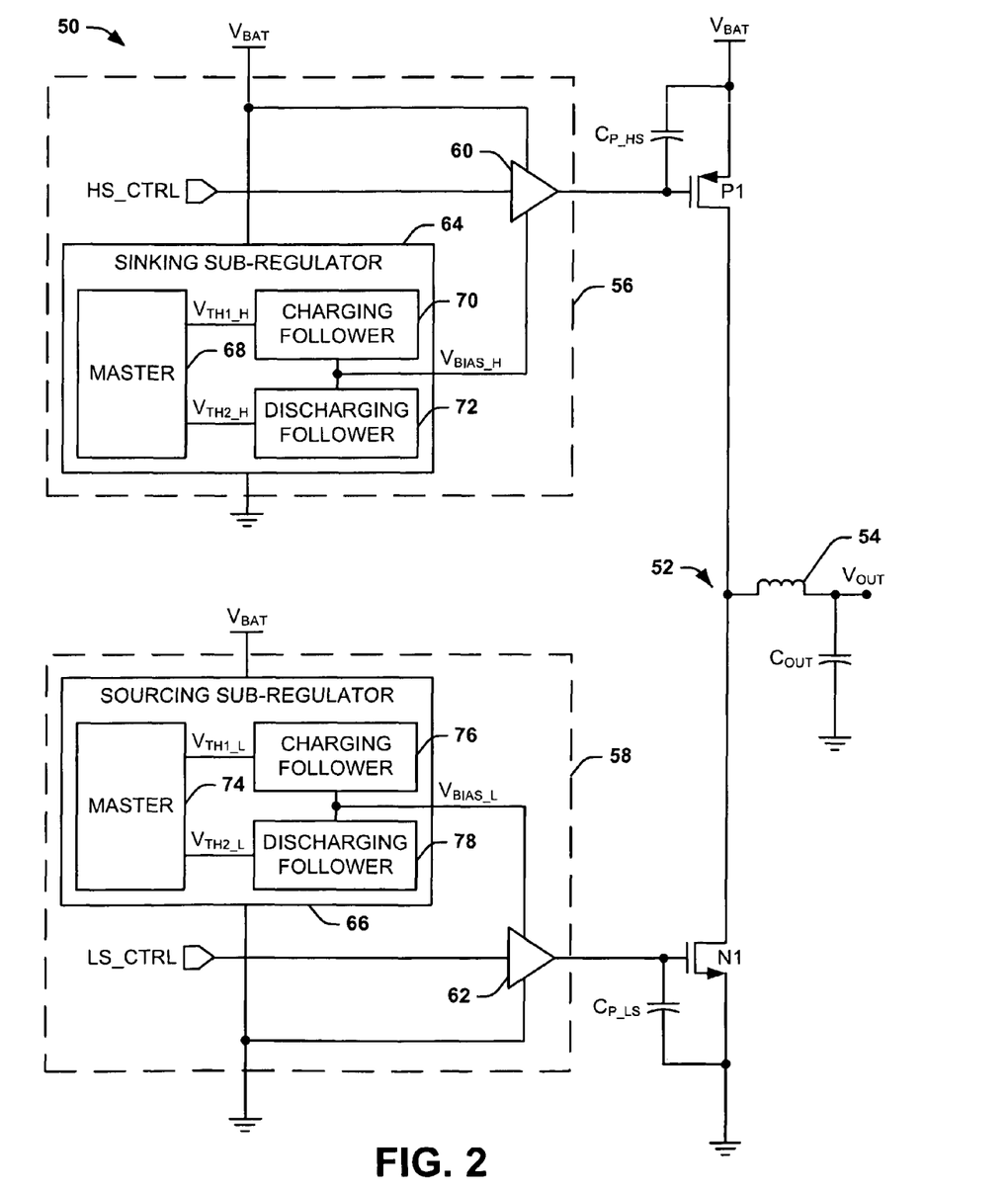
FIG. 2 illustrates an example of a power stage system in accordance with an aspect of the invention.

FIG. 2 illustrates an example of a power stage system 50 in accordance with an aspect of the invention. In the example of FIG. 2, the power stage system 50 can be a portion of a DC-DC power converter, such as a buck DC-DC power converter, that converts a positive rail voltage, demonstrated in the example of FIG. 2 as a battery voltage $V_{BAT}$, into an output voltage $V_{OUT}$. Specifically, the power stage system 50 includes a high-side power field effect transistor (FET) P1, demonstrated as a P-type FET, that is coupled between the battery voltage $V_{BAT}$ and a switching node 52. The power stage system 50 also includes a low-side power FET N1, demonstrated as an N-type FET, that is coupled between the switching node 52 and a negative rail voltage, demonstrated in the example of FIG. 2 as ground. The high and low-side power FETs P1 and N1 are periodically activated to provide a current flow through an inductor 54 to set the output voltage $V_{OUT}$ across a capacitor $C_{OUT}$ based on a switching duty-cycle of the high-side power FET P1 and the low-side power FET N1.

The power stage system 50 includes a high-side gate driver 56 and a low-side gate driver 58. The high-side gate driver 56 is configured to convert a high-side control signal HS_CTRL to a high-side switching signal HDRV via a driver 60 that controls the switching of the high-side power FET P1. Similarly, the low-side gate driver 58 is configured to convert a low-side control signal LS_CTRL to a low-side switching signal LDRV via a driver 62 that controls the switching of the low-side power FET N1. Each of the high-side control signal HS_CTRL and the low-side control signal LS_CTRL can be provided from a control system (not shown) that dictates the switching duty-cycle of the high-side power FET P1 and the low-side power FET N1. For example, the switching duty-cycle can be set by a feedback loop (not shown) based on the output voltage $V_{OUT}$.

Each of the high-side gate driver 56 and the low-side gate driver 58 are coupled between the battery voltage $V_{BAT}$ and ground. As an example, the battery voltage $V_{BAT}$ can have a magnitude that varies between 2.3 volts and 5.5 volts. However, the high-side power FET P1 and the low-side power FET N1 can have a maximum source-gate/gate-source breakdown voltage that is significantly less than the battery voltage $V_{BAT}$. As a result, biasing the gate of the high and low-side power FETs P1 and N1 between the battery voltage $V_{BAT}$ and ground can damage the high and low-side power FETs P1 and N1.

The high-side gate driver 56 thus includes a sinking sub-regulator 64 that is configured to generate a high-side bias voltage $V_{BIAS\_H}$. The high-side bias voltage $V_{BIAS\_H}$ has a magnitude that is approximately equal to the battery voltage $V_{BAT}$ minus a voltage $V_{GS\_MAX}$ that can be a maximum desired source-gate activation voltage of the high-side power FET P1. Likewise, the low-side gate driver 58 includes a sourcing sub-regulator 66 that is configured to generate a low-side bias voltage $V_{BIAS\_L}$. The low-side bias voltage $V_{BIAS\_L}$ has a magnitude that is approximately equal to the voltage $V_{GS\_MAX}$ that can also be a maximum desired gate-source activation voltage of the low-side power FET N1.

Each of the sinking sub-regulator 64 and the sourcing sub-regulator 66 can be configured substantially similar to the voltage regulator system 10 in the example of FIG. 1. Specifically, the sinking sub-regulator 64 includes a master stage 68 that generates a first threshold voltage $V_{TH1\_H}$ and a second threshold voltage $V_{TH2\_H}$, as well as a charging follower stage 70 and a discharging follower stage 72 that set the high-side bias voltage $V_{BIAS\_H}$ based on the first and second threshold voltages $V_{TH1\_H}$ and $V_{TH2\_H}$. Similarly, the sourcing sub-regulator 66 includes a master stage 74 that generates a first threshold voltage $V_{TH1\_L}$ and a second threshold voltage $V_{TH2\_L}$, as well as a charging follower stage 76 and a discharging follower stage 78 that set the low-side bias voltage $V_{BIAS\_L}$ based on the first and second threshold voltages $V_{TH1\_L}$ and $V_{TH2\_L}$.

Based on the sinking sub-regulator 64, the high-side power FET P1 is activated in a high voltage domain (i.e., between $V_{BAT}$ and $V_{BIAS\_H}$). Therefore, the sinking sub-regulator 64 is configured to generate the high-side bias voltage $V_{BIAS\_H}$ to be referenced to the battery voltage $V_{BAT}$, and is thus substantially constant relative to the battery voltage $V_{BAT}$. Thus, as the battery voltage $V_{BAT}$ decreases based on battery power usage, the high-side bias voltage $V_{BIAS\_H}$ likewise decreases by an approximately equal magnitude. Similarly, based on the sourcing sub-regulator 66, the low-side power FET N1 is activated in a low voltage domain (i.e., between ground and $V_{BIAS\_L}$). Therefore, the sourcing sub-regulator 66 is configured to generate the low-side bias voltage $V_{BIAS\_L}$ to be referenced to ground.

The sinking and sourcing sub-regulators 64 and 66 thus generate the respective high-side bias voltage $V_{BIAS\_H}$ and low-side bias voltage $V_{BIAS\_L}$ for proper operating voltage ranges of the high and low-side power FETs P1 and N1. However, the high and low-side power FETs P1 and N1 can include significant parasitic gate capacitances. As demonstrated in the example of FIG. 2, the high-side power FET P1 can have a gate-source capacitance $C_{P\_HS}$ that can cause a transient condition on the high-side bias voltage $V_{BIAS\_H}$ in response to a change in the logic-state of the switching signal HDRV. As also demonstrated in the example of FIG. 2, the low-side power FET N1 can have a gate-source capacitance $C_{P\_LS}$ that can cause a transient condition on the low-side bias voltage $V_{BIAS\_L}$ in response to a change in the logic-state of the switching signal LDRV. Thus, the sinking and sourcing sub-regulators 64 and 66 can each be configured to compensate for the transient conditions occurring on the respective high and low-side bias voltages $V_{BIAS\_H}$ and $V_{BIAS\_L}$.

As an example, upon the switching signal HDRV switching from a logic-high state to a logic-low state to activate the high-side power FET P1, the gate of the high-side power FET P1 can become coupled to the high-side bias voltage $V_{BIAS\_H}$. As a result, the gate-source capacitance $C_{P\_HS}$ can cause a transient condition that increases the high-side bias voltage $V_{BIAS\_H}$. In response, the discharging follower stage 72 can increase a current flow from the output node of the high-side bias voltage $V_{BIAS\_H}$ to ground to discharge the gate-source capacitance $C_{P\_HS}$ of the high-side power FET P1. The discharging follower stage 72 can include a plurality of mirrored current sources, such that the slew-rate of discharge of the gate-source capacitance $C_{P\_HS}$ is very high. As a result, the discharging follower stage 72 can substantially immediately return the high-side bias voltage $V_{BIAS\_H}$ to the steady-state magnitude. In addition, in the event that the discharging follower stage 72 draws excessive current from the output node, such that the high-side bias voltage $V_{BIAS\_H}$ begins to decrease less than the steady-state magnitude, the charging follower stage 70 can begin conducting current to the output node. Accordingly, the high-side bias voltage $V_{BIAS\_H}$ can return to the steady-state magnitude.

The operation of the sourcing sub-regulator 66 is substantially the same as the sinking sub-regulator 64 with respect to the low-side power FET N1. Specifically, upon the switching signal LDRV switching from a logic-low state to a logic-high state to activate the low-side power FET N1, the gate of the low-side power FET N1 can become coupled to the low-side bias voltage $V_{BIAS\_L}$. As a result, the gate-source capacitance $C_{P\_LS}$ can cause a transient condition that decreases the low-side bias voltage $V_{BIAS\_L}$. In response, the charging follower stage 76 can increase a current flow to the output node of the low-side bias voltage $V_{BIAS\_L}$ from the battery voltage $V_{BAT}$ to discharge the gate-source capacitance $C_{P\_LS}$ of the low-side power FET N1. The charging follower stage 76 can include a plurality of mirrored current sources, such that the slew-rate of discharge of the gate-source capacitance $C_{P\_LS}$ is very high. As a result, the charging follower stage 76 can substantially immediately return the low-side bias voltage $V_{BIAS\_L}$ to the steady-state magnitude. In addition, in the event that the charging follower stage 76 provides excessive current to the output node, such that the low-side bias voltage $V_{BIAS\_L}$ begins to increase greater than the steady-state magnitude, the discharging follower stage 78 can begin conducting current from the output node. Accordingly, the low-side bias voltage $V_{BIAS\_L}$ can return to the steady-state magnitude.

Therefore, the sinking sub-regulator 64 and the sourcing sub-regulator 66 can generate and maintain substantially constant values of the respective high and low-side bias voltages $V_{BIAS\_H}$ and $V_{BIAS\_L}$. Specifically, the sinking sub-regulator 64 and the sourcing sub-regulator 66 can rapidly return a transient increase and/or decrease of the respective high and low-side bias voltages $V_{BIAS\_H}$ and $V_{BIAS\_L}$ to a steady-state magnitude based on the high slew-rate of the discharging follower 72 and the charging follower 76. Because of the slew-enhancement of the discharging follower 72 and the charging follower 76, large external capacitors that can couple the battery voltage $V_{BAT}$ and the high-side bias voltage $V_{BIAS\_H}$ and can couple the low-side bias voltage $V_{BIAS\_L}$ and ground can be omitted in a given power converter that includes the sinking sub-regulator 64 and the sourcing sub-regulator 66. Accordingly, an integrated circuit that includes the sinking sub-regulator 64 and the sourcing sub-regulator 66 can be configured without additional pins to accommodate the external capacitors, thus conserving space and cost.

It is to be understood that the power stage system 50 is not intended to be limited to the example of FIG. 2. For example, the high and low-side power FETs P1 and N1 can each include parasitic capacitance between the gate and drain. However, this has been omitted in the example of FIG. 2 because such capacitance can typically be small in magnitude, and the effect of which can be included in the gate-source capacitances $C_{P\_HS}$ for the high-side power FET P1 and $C_{P\_LS}$ for the low-side power FET N1. As another example, the power stage system 50 is not limited to use in a buck DC-DC converter, but could be implemented in other types of power converters, as well. Furthermore, the power stage system 50 is not limited to receiving power from a battery, but could instead receive power from any DC power source. Accordingly, the power stage system 50 can be configured in any of a variety of ways.

Figure 3:
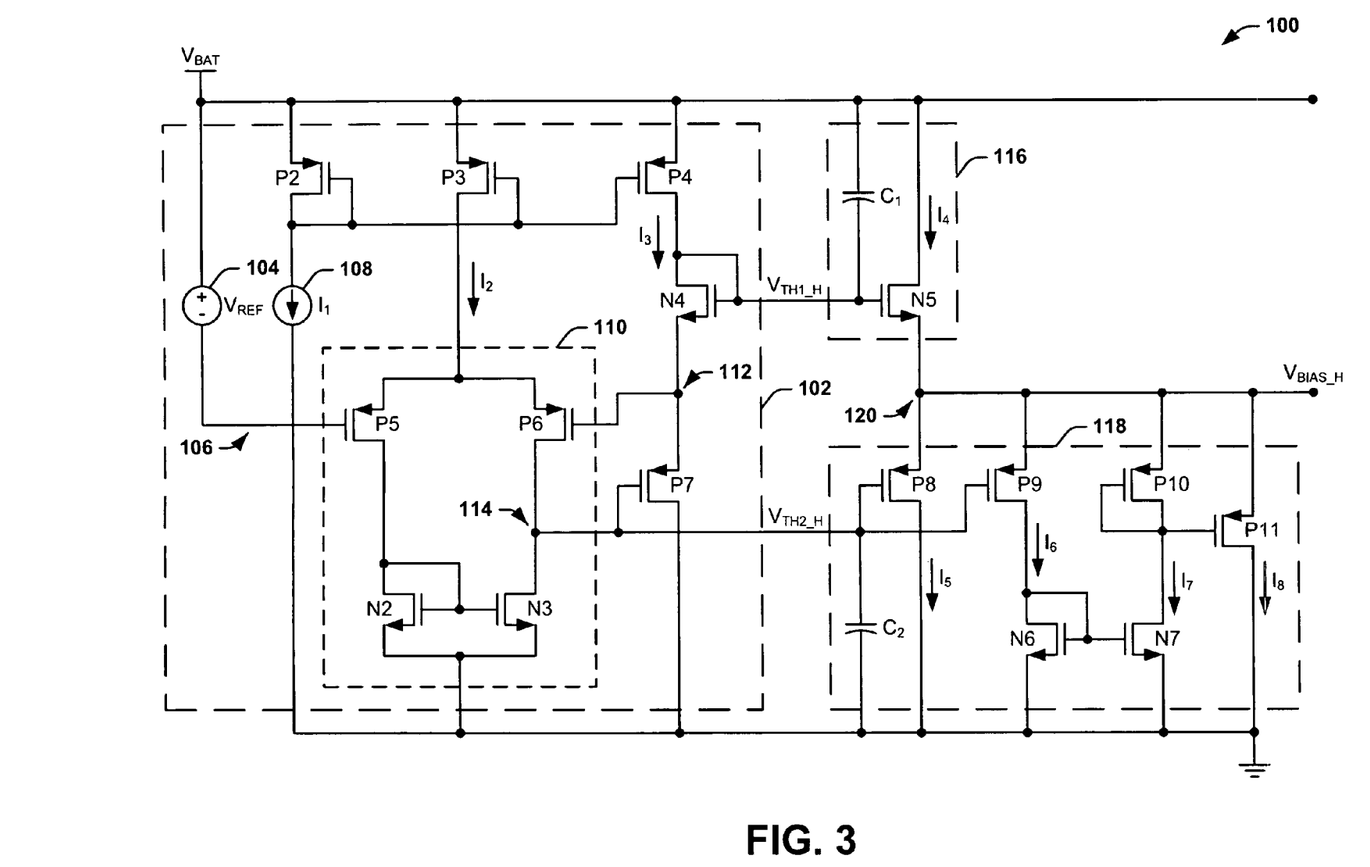
FIG. 3 illustrates an example of a voltage regulator circuit in accordance with an aspect of the invention.

FIG. 3 illustrates an example of a voltage regulator circuit 100 in accordance with an aspect of the invention. As an example, the voltage regulator circuit 100 can be configured substantially similar to the sinking sub-regulator 64 in the example of FIG. 2. Therefore, reference is to be made to the example of FIG. 2 in the following description of the example of FIG. 3.

The voltage regulator circuit 100 includes a master stage 102. The master stage 102 includes a reference voltage source 104 that is configured to set a reference voltage $V_{REF}$ between the battery voltage $V_{BAT}$ and a node 106, such that the node 106 has a voltage that is approximately equal to ($V_{BAT}$−$V_{REF}$). As an example, the voltage $V_{REF}$ can be approximately equal to the voltage $V_{GS\_MAX}$, such as the desired activation voltage of the high-side power FET P1. Therefore, the node 106 has a magnitude that is approximately equal to a steady-state magnitude of the high-side bias voltage $V_{BIAS\_H}$. The voltage regulator circuit 100 also includes a bias current source 108 that is configured to conduct a bias current $I_1$ from the battery voltage $V_{BAT}$ to ground. The bias current $I_1$ flows through a P-FET P2, which mirrors the bias current to a first mirrored current source via a P-FET P3 as a second current $I_2$ and to a second mirrored current source via a P-FET P4 as a third current $I_3$. The second and third currents $I_2$ and $I_3$ can thus be approximately equal to or proportional to the bias current $I_1$.

The second current $I_2$ flows through an amplifier 110 to ground. The amplifier 110 is formed from a combination of a P-FET P5 and a P-FET P6 that form a differential pair and an N-FET N2 and an N-FET N3 that form an active load to the differential pair. Specifically, the N-FETs N2 and N3 form a current-mirror to divide the second current $I_2$ substantially equally between the P-FETs P5 and P6. The P-FET P5 has a gate that is coupled to the node 106, and the P-FET P6 has a gate at a node 112. The amplifier 110 also has an output node 114 that interconnects the P-FET P6 and the N-FET N3.

The third current $I_3$ flows through an N-FET N4 and a P-FET P7 that are coupled in series between the P-FET P4 and ground. The N-FET N4 and the P-FET P7 each have a source that is coupled to the node 112. The N-FET N4 has a gate that is coupled to its drain, and the P-FET P7 has a gate that is coupled to the amplifier output node 114. Therefore, in response to the node 106 being set at a magnitude of ($V_{BAT}$−$V_{REF}$), the second current $I_2$ being provided through the amplifier 110, and the third current $I_3$ being provided through the N-FET N4 and the P-FET P7, the amplifier 110 is configured to provide a substantial unity gain at the node 112 relative to the node 106. Specifically, the P-FET P7 and the P-FET P6 form a feedback loop that regulates the voltage at the node 112 to be approximately equal to the voltage at the node 106.

Based on the unity gain of the node 112 with respect to the node 106, the node 112 therefore has a voltage potential that is approximately equal to the steady-state magnitude of the high-side bias voltage $V_{BIAS\_H}$. The voltage at the node 112 is substantially static, and therefore is substantially unaffected by transient conditions that could occur on the high-side bias voltage $V_{BIAS\_H}$. As a result, the master stage 102 can set the voltage at the gate of the N-FET N4 as the first threshold voltage $V_{TH1\_H}$ and the voltage at the gate of the P-FET P7 as the second threshold voltage $V_{TH2\_H}$ based on the magnitude of the voltage at the node 112. Specifically, as demonstrated in the example of FIG. 3, the node 112 is coupled to the sources of each of the N-FET N4 and the P-FET P7. Accordingly, the first and second threshold voltages $V_{TH1\_H}$ and $V_{TH2\_H}$ differ from the steady-state magnitude of the high-side bias voltage $V_{BIAS\_H}$ by a gate-source voltage of the N-FET N4 and the P-FET P7.

The voltage regulator circuit 100 also includes a charging follower stage 116 and a discharging follower stage 118. The charging follower stage 116 includes an N-FET N5 having a drain coupled to the battery voltage $V_{BAT}$, a source that is coupled to an output node 120 having a voltage of the high-side bias voltage $V_{BIAS\_H}$, and a gate that is controlled by the first threshold voltage $V_{TH1\_H}$. As an example, the N-FET N5 can be matched with the N-FET N4, such that the N-FETs N4 and N5 operate substantially the same with respect to process and temperature variations. Based on the gate configurations of the N-FETs N4 and N5, the third current $I_3$ is mirrored through the N-FET N5 as a fourth current $I_4$. In addition, the charging follower stage 116 includes a capacitor $C_1$ that interconnects the battery voltage $V_{BAT}$ and the gate of the N-FETs N4 and N5. The capacitor $C_1$ can thus stabilize the first threshold voltage $V_{TH1\_H}$, such as in response to variations of the fourth current $I_4$.

The discharging follower stage 118 includes a pair of P-FETs P8 and P9 each having a drain coupled to ground, a source that is coupled to the output node 120, and a gate that is controlled by the second threshold voltage $V_{TH2\_H}$. As an example, the P-FETs P8 and P9 can be matched with the P-FET P7. Based on the gate configurations of the P-FETs P7, P8, and P9, the third current $I_3$ is mirrored through the P-FET P8 as a fifth current $I_5$ and through the P-FET P9 as a sixth current $I_6$. In addition, the sixth current $I_6$ is mirrored through a P-FET P10 as a seventh current $I_7$ via a pair of N-FETs N6 and N7, and the seventh current $I_7$ is mirrored through a P-FET P11 as an eighth current $I_8$ based on the mirror-like shared gate configuration of the P-FETs P10 and P11. Therefore, the discharging follower stage 118 includes a plurality of parallel current paths from the output node 120 to ground. Furthermore, the discharging follower stage 118 includes a capacitor $C_2$ that interconnects the gate of the P-FETs P7, P8, and P9 with ground. The capacitor $C_2$ can thus stabilize the second threshold voltage $V_{TH2\_H}$, such as in response to variations of the fifth and sixth currents $I_5$ and $I_6$.

During a steady-state of the voltage regulator circuit 100, the fourth current $I_4$ is approximately equal to a sum of the currents $I_5$ through $I_8$. Therefore, the fourth current $I_4$ and the currents $I_5$ through $I_8$ are quiescent currents that set the magnitude of the high-side bias voltage $V_{BIAS\_H}$. Accordingly, the high-side bias voltage $V_{BIAS\_H}$ has a magnitude that is approximately equal to $(V_{BAT} - V_{REF})$ during the steady-state.

Upon the occurrence of a transient condition, such as the coupling of the output node 120 to the gate of the high-side power FET P1, the high-side bias voltage $V_{BIAS\_H}$ can begin to increase. However, as described above, the second threshold voltage $V_{TH2\_H}$ is substantially constant with respect to the battery voltage $V_{BAT}$. Therefore, in response to the transient increase in the high-side bias voltage $V_{BIAS\_H}$, the source-gate voltage of each of the P-FETs P8 through P11 likewise increases. Accordingly, the currents $I_5$ through $I_8$ each increase, thus compensating for the transient increase of the high-side bias voltage $V_{BIAS\_H}$. In addition, because the discharging follower stage 118 includes a plurality of current sources that collectively conduct the separate currents $I_5$ through $I_8$ from the output node 120, the transient increase of the high-side bias voltage $V_{BIAS\_H}$ can be compensated for very rapidly (i.e., with a significantly high slew-rate). Furthermore, in the event that the currents $I_5$ through $I_8$ draw enough current to begin decreasing the high-side bias voltage $V_{BIAS\_H}$ to a magnitude that is less than the steady-state magnitude, the gate-source voltage of the N-FET N5 in the charging follower stage 116 increases. As a result, the current $I_4$ can increase to compensate for the decrease in the high-side bias voltage $V_{BIAS\_H}$, thus pulling-up and ultimately stabilizing the high-side bias voltage $V_{BIAS\_H}$ to the steady-state magnitude.

It is to be understood that the voltage regulator circuit 100 is not intended to be limited to the example of FIG. 3. As an example, the charging follower stage 116 and the discharging follower stage 118 are not limited to having one current source and four current sources, respectively, to conduct the respective currents $I_4$ through $I_8$. For example, more or less current sources can be added to either of the charging follower stage 116 and the discharging follower stage 118 to adjust the slew associated with transient conditions of the high-side bias voltage $V_{BIAS\_H}$. Furthermore, it is to be understood that the master stage 102 can be configured differently to set the voltage at the node 112. Accordingly, the voltage regulator circuit 100 can be configured in any of a variety of ways.

Figure 4:
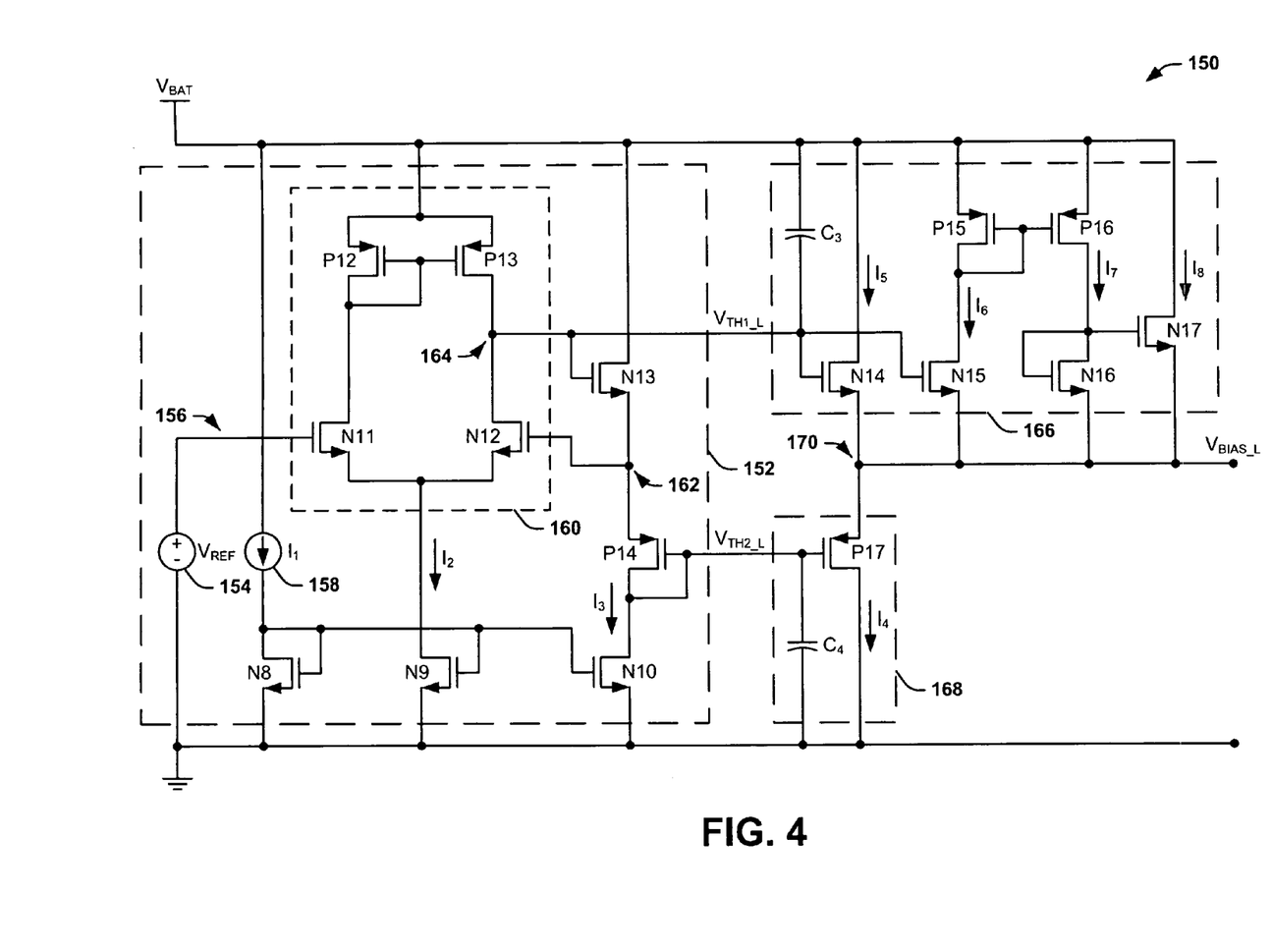
FIG. 4 illustrates another example of a voltage regulator circuit in accordance with an aspect of the invention.

FIG. 4 illustrates another example of a voltage regulator circuit 150 in accordance with an aspect of the invention. As an example, the voltage regulator circuit 150 can be configured substantially similar to the sourcing sub-regulator 66 in the example of FIG. 2. Therefore, reference is to be made to the example of FIG. 2 in the following description of the example of FIG. 4.

The voltage regulator circuit 150 includes a master stage 152. The master stage 152 includes a reference voltage source 154 that is configured to set a reference voltage $V_{REF}$ at a node 156. As an example, the voltage $V_{REF}$ can be approximately equal to the voltage $V_{GS\_MAX}$, such as the desired activation voltage of the low-side power FET N1. Therefore, the node 156 has a magnitude that is approximately equal to a steady-state magnitude of the low-side bias voltage $V_{BIAS\_L}$. The voltage regulator circuit 150 also includes a bias current source 158 that is configured to conduct a bias current $I_1$ from the battery voltage $V_{BAT}$ to ground. The bias current $I_1$ flows through an N-FET N8, which mirrors the bias current to a first mirrored current source via an N-FET N9 as a second current $I_2$ and to a second mirrored current source via a N-FET N10 as a third current $I_3$. The second and third currents $I_2$ and $I_3$ can thus be approximately equal to or proportional to the bias current $I_1$.

Similar to as described above in the example of FIG. 3, the voltage regulator circuit 150 includes an amplifier 160 through which the second current $I_2$ flows from the battery voltage $V_{BAT}$. The amplifier 160 is formed from a combination of an N-FET N11 and an N-FET N12 that form a differential pair and a P-FET P12 and a P-FET P13 that form an active load to the differential pair. The N-FET N11 has a gate that is coupled to the node 156, and the N-FET N12 has a gate at a node 162. The amplifier 160 also has an output node 164 that interconnects the P-FET P13 and the N-FET N12. Therefore, similar to as described above in the example of FIG. 3, the amplifier 160 is configured to set a voltage at the node 162 that is approximately equal to the voltage $V_{REF}$ based on a feedback configuration between the N-FET N12 and an N-FET N13 through which the current $I_3$ flows.

Based on the unity gain of the node 162 with respect to the node 156, the node 162 therefore has a voltage potential that is approximately equal to the steady-state magnitude of the low-side bias voltage $V_{BIAS\_L}$. The voltage at the node 162 is substantially static, and therefore is substantially unaffected by transient conditions that could occur on the low-side bias voltage $V_{BIAS\_L}$. As a result, the master stage 152 can set the first and second threshold voltages $V_{TH1\_L}$ and $V_{TH2\_L}$ at the gates of the N-FET N13 and at a gate of a P-FET P14, respectively. Accordingly, the first and second threshold voltages $V_{TH1\_L}$ and $V_{TH2\_L}$ differ from the steady-state magnitude of the low-side bias voltage $V_{BIAS\_L}$ by a gate-source voltage of the N-FET N13 and the P-FET P14.

The voltage regulator circuit 150 also includes a charging follower stage 166 and a discharging follower stage 168. The charging follower stage 166 includes a pair of N-FETs N14 and N15 each having a drain coupled to the battery voltage $V_{BAT}$, a source that is coupled to an output node 170 having a voltage of the low-side bias voltage $V_{BIAS\_L}$, and a gate that is controlled by the first threshold voltage $V_{TH1\_L}$. As an example, the N-FETs N14 and N15 can be matched with the N-FET N13. Based on the gate configurations of the N-FETs N13, N14, and N15, the third current $I_3$ is mirrored through the N-FET N14 as a fifth current $I_5$ and through the N-FET N15 as a sixth current $I_6$. In addition, the sixth current $I_6$ is mirrored through an N-FET N16 as a seventh current $I_7$ via a pair of P-FETs P15 and P16, and the seventh current $I_7$ is mirrored through an N-FET N17 as an eighth current $I_8$ based on the mirror-like shared-gate configuration of the N-FETs N16 and N17. Therefore, the charging follower stage 166 includes a plurality of parallel current paths from the battery voltage $V_{BAT}$ to the output node 170. Furthermore, the charging follower stage 166 includes a capacitor $C_3$ that interconnects the gate of the N-FETs N13, N14, and N15 and the battery voltage $V_{BAT}$. The capacitor $C_3$ can thus stabilize the first threshold voltage $V_{TH1\_L}$, such as in response to variations of the fifth and sixth currents $I_5$ and $I_6$.

The discharging follower stage 168 includes a P-FET P17 having a drain coupled to ground, a source that is coupled to the output node 170, and a gate that is controlled by the second threshold voltage $V_{TH2\_L}$. As an example, the P-FET P17 can be matched with the P-FET P14. Based on the gate configurations of the P-FETs P14 and P17, the third current $I_3$ is mirrored through the P-FET P17 as a fourth current $I_4$. In addition, the discharging follower stage 168 includes a capacitor $C_4$ that interconnects ground and the gate of the P-FETs P14 and P17. The capacitor $C_4$ can thus stabilize the second threshold voltage $V_{TH2\_L}$, such as in response to variations of the fourth current $I_4$.

Therefore, similar to as described above in the example of FIG. 3, the fourth current $I_4$ is approximately equal to a sum of the currents $I_5$ through $I_8$ during a steady-state to set the magnitude of the low-side bias voltage $V_{BIAS\_L}$. Accordingly, the low-side bias voltage $V_{BIAS\_L}$ has a magnitude that is approximately equal to the voltage $V_{REF}$ during the steady-state. In addition, upon the occurrence of a transient condition, such as the coupling of the output node 170 to the gate of the low-side power FET N1, the low-side bias voltage $V_{BIAS\_L}$ can begin to decrease. Therefore, in response to the transient decrease in the low-side bias voltage $V_{BIAS\_L}$, the gate-source voltage of each of the N-FETs N14 through N17 increases. Accordingly, the currents $I_4$ through $I_7$ each increase, thus compensating for the transient decrease of the low-side bias voltage $V_{BIAS\_L}$. In addition, because the charging follower stage 166 includes a plurality of current sources that collectively conduct the separate currents $I_4$ through $I_7$ from the output node 170, the transient decrease of the low-side bias voltage $V_{BIAS\_L}$ can be compensated for very rapidly. Furthermore, in the event that the currents $I_4$ through $I_7$ source enough current to begin increasing the low-side bias voltage $V_{BIAS\_L}$ to a magnitude that is greater than the steady-state magnitude, the source-gate voltage of the P-FET P17 in the discharging follower stage 168 increases. As a result, the current $I_8$ can increase to compensate for the increase in the low-side bias voltage $V_{BIAS\_L}$, thus pulling-down and ultimately stabilizing the low-side bias voltage $V_{BIAS\_L}$ to the steady-state magnitude.

It is to be understood that the voltage regulator circuit 150 is not intended to be limited to the example of FIG. 3. As an example, the charging follower stage 166 and the discharging follower stage 168 are not limited to having four current sources and one current source, respectively, to conduct the respective currents $I_4$ through $I_8$. For example, more or less current sources can be added to either of the charging follower stage 166 and the discharging follower stage 168 to adjust the slew associated with transient conditions of the low-side bias voltage $V_{BIAS\_L}$. Furthermore, it is to be understood that the master stage 152 can be configured differently to set the voltage at the node 162. Accordingly, the voltage regulator circuit 150 can be configured in any of a variety of ways.

Figure 5:
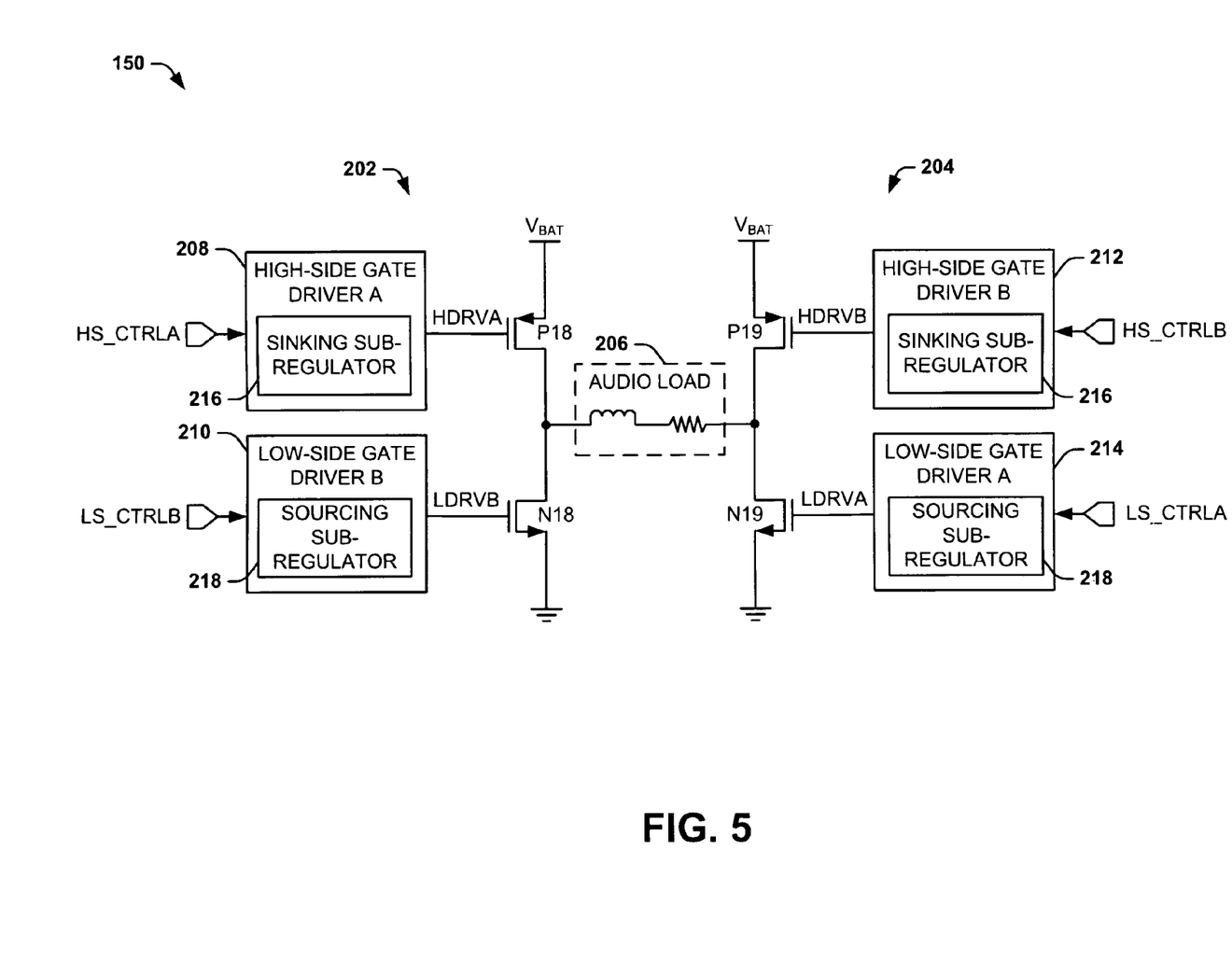
FIG. 5 illustrates an example of an audio amplifier system in accordance with an aspect of the invention.

FIG. 5 illustrates an example of an audio amplifier system 200 in accordance with an aspect of the invention. The audio amplifier system 200 includes a first power stage 202 and a second power stage 204 that are coupled via an audio load 206. As an example, the audio load can be an audio speaker.

The first power stage 202 includes a first high-side gate driver 208 (designated "A") and a first low-side gate driver 210 (designated "B"). Similarly, the second power stage 204 includes a second high-side gate driver 212 (designated "B") and a second low-side gate driver 214 (designated "A"). Each of the first and second high-side gate drivers 208 and 212 and each of the first and second low-side gate drivers 210 and 214 can be configured substantially similar to the high-side gate driver 56 and the low-side gate driver 58, respectively, in the example of FIG. 2. The first high-side gate driver 208 can generate a switching signal HDRVA to activate a high-side power FET P18 based on a switching duty-cycle of a high-side control signal HS_CTRLA. Similarly, the second high-side gate driver 212 can generate a switching signal HDRVB to activate a high-side power FET P19 based on a switching duty-cycle of a high-side control signal HS_CTRLB. In addition, the first low-side gate driver 210 can generate a switching signal LDRVB to activate a low-side power FET N18 based on a switching duty-cycle of a low-side control signal LS_CTRLB. Similarly, the second low-side gate driver 214 can generate a switching signal LDRVA to activate a low-side power FET N19 based on a switching duty-cycle of a low-side control signal LS_CTRLA.

As demonstrated in the example of FIG. 5, each of the first and second high-side gate drivers 208 and 212 includes a sinking sub-regulator 216 and each of the first and second low-side gate drivers 210 and 214 includes a sourcing sub-regulator 218. As an example, the sinking sub-regulators 216 can each be configured substantially similar to the voltage regulator circuit 100 in the example of FIG. 3, and the sourcing sub-regulators 218 can each be configured substantially similar to the voltage regulator circuit 150 in the example of FIG. 4. Therefore, the high-side switching signals HDRVA and HDRVB can be provided in a high voltage domain between the battery voltage $V_{BAT}$ and a high-side bias voltage that is regulated to be substantially constant with respect to the battery voltage $V_{BAT}$. In addition, the low-side switching signals LDRVA and LDRVB can be provided in a low voltage domain between ground and a low-side bias voltage that is regulated to be substantially constant with respect to ground. Furthermore, the sinking sub-regulators 216 and the sourcing sub-regulators 218 can be configured to compensate for transient conditions that can affect the respective high and low-side bias voltages, such as based on gate capacitance of the high-side power FETs P18 and P19 and the low-side power FETs N18 and N19, respectively, at a slew-rate that is based on a quantity of current sources in respective charging and discharging follower stages.

In the example of FIG. 5, the audio amplifier system 200 is configured as an H-bridge. Specifically, the first and second power stages 202 and 204 can collectively operate to provide a current flow in one of two directions through the audio load 206 based on the switching duty-cycles of the high-side control signals HS_CTRLA and HS_CTRLB as well as the low-side control signals LS_CTRLA and LS_CTRLB. As an example, the switching duty-cycle of the high-side control signal HS_CTRLA can be substantially the same as the switching duty-cycle of the low-side control signal LS_CTRLA. Therefore, the first high-side gate driver 208 and the second low-side gate driver 214 can substantially concurrently activate the high-side power FET P18 and the low-side power FET N19 to provide a current path from the battery voltage $V_{BAT}$ in a first direction through the audio load 206 to ground. Similarly, the switching duty-cycle of the high-side control signal HS_CTRLB can be substantially the same as the switching duty-cycle of the low-side control signal LS_CTRLB. Therefore, the second high-side gate driver 212 and the first low-side gate driver 210 can substantially concurrently activate the high-side power FET P19 and the low-side power FET N18 to provide a current path from the battery voltage $V_{BAT}$ in a second direction through the audio load 206 to ground.

It is to be understood that the audio amplifier system 200 is not limited to the description in the example of FIG. 5. Specifically, the audio amplifier system 200 has been described simplistically, such that a number of components have been omitted. Thus, the example of FIG. 5 merely demonstrates an application of voltage regulator circuits, such as the voltage regulator circuits 100 and 150 described in the examples of FIGS. 3 and 4, respectively.

Figure 6:
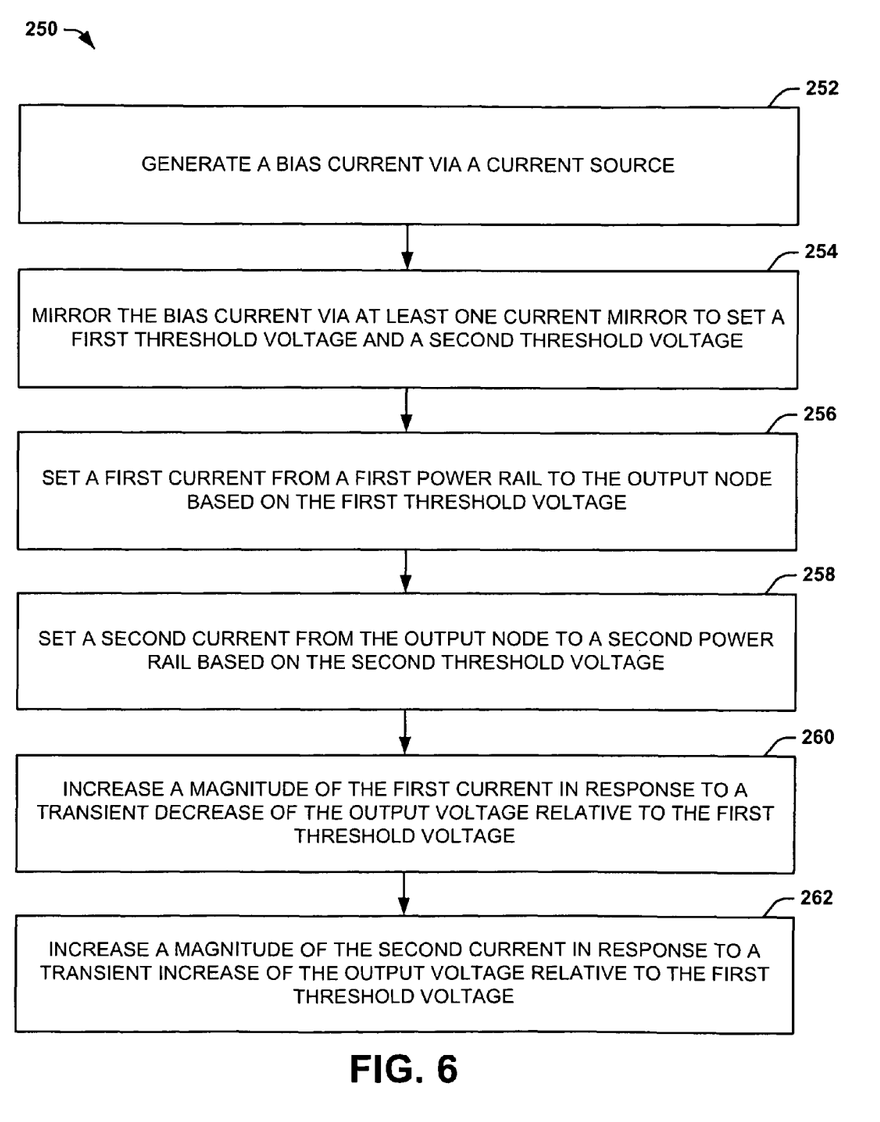
FIG. 6 illustrates an example of a method for regulating a substantially constant magnitude of an output voltage at an output node in accordance with an aspect of the invention.

In view of the foregoing structural and functional features described above, certain methods will be better appreciated with reference to FIG. 6. It is to be understood and appreciated that the illustrated actions, in other embodiments, may occur in different orders and/or concurrently with other actions. Moreover, not all illustrated features may be required to implement a method.

FIG. 6 illustrates an example of a method 250 for regulating a substantially constant magnitude of an output voltage at an output node in accordance with an aspect of the invention. At 252, a bias current is generated via a current source. The bias current can be generated in a master stage. At 254, the bias current is mirrored via at least one current-mirror to set a first threshold voltage and a second threshold voltage. The first threshold voltage can have a magnitude that is greater than the second threshold voltage. The threshold voltages can be set based on a feedback arrangement between an amplifier that is coupled to one current-mirror and a pair of control transistors that are coupled to another of the current-mirrors.

At 256, a first current is set from a first power rail to the output node based on the first threshold voltage. The first power rail can be a battery voltage rail. The first current can be provided from a charging follower stage, and can be set based on a gate-source voltage of at least one transistor current source. Specifically, the gate of the transistor current source can be controlled by the first threshold voltage and the source of the transistor current source can be coupled to the output node to provide the output voltage. At 258, a second current is set from the output node to a second power rail based on the second threshold voltage, the first and second currents having substantially equal magnitudes during a steady-state condition. The second power rail can be ground. The second current can be provided from a discharging follower stage, and can be set based on a gate-source voltage of at least one transistor current source. Specifically, the gate of the transistor current source can be controlled by the second threshold voltage and the source of the transistor current source can be coupled to the output node to provide the output voltage. The first and second currents can thus set a quiescent current to generate a steady-state magnitude of the output voltage.

At 260, a magnitude of the first current is increased in response to a transient decrease of the output voltage relative to the first threshold voltage. The increase in magnitude of the first current can result based on an increase in the gate-source voltage of the one or more transistor current sources through which the first current is provided. Thus, the increased current can charge the output node to compensate for the transient decrease of the output voltage. At 262, a magnitude of the second current is increased in response to a transient increase of the output voltage relative to the second threshold voltage. The increase in magnitude of the second current can result based on an increase in the source-gate voltage of the one or more transistor current sources through which the second current is provided. Thus, the increased current can discharge the output node to compensate for the transient increase of the output voltage. In addition, one of the charging follower stage and discharging follower stage can include more transistor current sources than the other, resulting in a more rapid slew of transient compensation in response to substantially equal transient changes in the output voltage.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A regulator circuit that regulates a substantially constant magnitude of an output voltage at an output node, the circuit comprising:
   a master stage configured to set a first threshold voltage and a second threshold voltage, the first threshold voltage having a magnitude that is greater than the second threshold voltage;
   a charging follower stage configured to conduct a first current from a first power rail to the output node, the first current increasing in response to a transient decrease of the output voltage relative to the first threshold voltage; and
   a discharging follower stage configured to conduct a second current from the output node to a second power rail, the second current increasing in response to a transient increase of the output voltage relative to the second threshold voltage.

2. The circuit of claim 1, wherein the circuit is configured as a sinking regulator circuit that generates the output voltage and the first and second threshold voltages as substantially constant relative to the first power rail, and wherein the discharging follower stage comprises a plurality of mirrored current sources that interconnect the output node and the second power rail and each conduct a portion of the second current.

3. A high-side gate driver circuit for controlling a high-side power field-effect transistor (FET) based on a switching duty-cycle comprising the circuit of claim 2.

4. The circuit of claim 1, wherein the circuit is configured as a sourcing regulator circuit that generates the output voltage and the first and second threshold voltages as substantially constant relative to the second power rail, and wherein the charging follower stage comprises a plurality of mirrored current sources that interconnect the output node and the first power rail and each conduct a portion of the first current.

5. A low-side gate driver circuit for controlling a low-side power field-effect transistor (FET) based on a switching duty-cycle comprising the circuit of claim 4.

6. The circuit of claim 1, wherein each of the charging follower stage and the discharging follower stage comprise at least one transistor current source having a gate that is biased by the first threshold voltage and the second threshold voltage, respectively, and a source that is coupled to the output node, such that the transient increase and the transient decrease of the output voltage affect a gate-source voltage of the at least one transistor current source in each of the charging and discharging follower stages.

7. The circuit of claim 6, wherein one of the charging and discharging follower stages comprise a plurality of transistor current sources that is greater than the at least one transistor current source of the other of the charging and discharging follower stages to increase a magnitude of the respective one of the first and second currents in response to a substantially equal transient of the output voltage than the other of the charging and discharging follower stages.

8. The circuit of claim 1, wherein the master stage comprises a current source that generates a bias current and a plurality of current-mirrors that mirror the bias current, the bias current being mirrored by a first of the current-mirrors to the charging follower stage to set the first current and to the discharging follower stage to set the second current.

9. The circuit of claim 8, wherein the master stage further comprises an amplifier through which the bias current is mirror via a second of the plurality of current-mirrors, the amplifier regulating a control voltage at a control node having a magnitude that is approximately equal to the output voltage.

10. The circuit of claim 9, wherein the master stage further comprises a first and second control transistor arranged in a current path in the first of the plurality of the current-mirrors, the control node being coupled to a source of each of the first and second control transistors to set the first and second threshold voltages at gates of each of the first and second control transistors, respectively.

11. A half-bridge power stage of a power converter comprising the regulator circuit of claim 1.

12. A full-bridge power stage of an audio power amplifier comprising the regulator circuit of claim 1.

13. A regulator circuit that regulates a substantially constant magnitude of an output voltage at an output node, the circuit comprising:

means for amplifying a reference voltage based on a bias current to generate an amplified voltage, the amplified voltage having a substantially constant magnitude that is approximately equal to the output voltage;

means for setting a first threshold voltage and a second threshold voltage based on the amplified voltage, the first threshold voltage having a magnitude that is greater than the amplified voltage and the second threshold voltage having a magnitude that is less than the amplified voltage;

means for sourcing current to the output node from a first power rail in response to a transient decrease of the output voltage relative to the first threshold voltage; and means for sinking current from the output node to a second power rail in response to a transient increase of the output voltage relative to the second threshold voltage.

14. The circuit of claim 13, wherein one of the means for sourcing and the means for sinking comprises plural means for conducting current that collectively conduct a greater magnitude of current than the other of the means for sourcing and the means for sinking in response to a substantially equal transient decrease or increase, respectively, of the output voltage relative to the respective one of the first and second threshold voltage.

15. The circuit of claim 13, further comprising plural means for mirroring the bias current, a first of the plural means for mirroring being coupled to a first current path that comprises the means for amplifying and a second of the plural means for mirroring being coupled to a second current path, the second current path comprising means for setting the first threshold voltage based on an output of the means for amplifying and means for setting the second threshold voltage based on the output of the means for amplifying.

* * * * *